(12) United States Patent
Daibo (10) Patent No.: US 9,418,776 B2
(45) Date of Patent: Aug. 16, 2016

(54) OXIDE SUPERCONDUCTOR WIRE AND SUPERCONDUCTING COIL

(71) Applicant: FUJIKURA LTD., Koto-ku, Tokyo (JP)

(72) Inventor: Masanori Daibo, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/175,066

(22) Filed: Feb. 7, 2014

(65) Prior Publication Data
US 2014/0155269 A1    Jun. 5, 2014

Related U.S. Application Data

(63) Continuation-in-part of application No. PCT/JP2013/065938, filed on Jun. 10, 2013.

(30) Foreign Application Priority Data

Jun. 11, 2012  (JP) ................. 2012-131927

(51) Int. Cl.
*H01L 39/00* (2006.01)
*H01B 12/02* (2006.01)
(Continued)

(52) U.S. Cl.
CPC ............ *H01B 12/02* (2013.01); *H01B 3/445* (2013.01); *H01F 6/06* (2013.01); *H01L 39/143* (2013.01); *H01B 3/308* (2013.01); *H01B 7/00* (2013.01)

(58) Field of Classification Search
CPC .......... H01B 12/02; H01B 12/06; H01B 7/00; H01B 3/306; H01B 3/308; H01B 3/445; H01B 3/30; H01F 6/06; H01F 5/06; H01L 39/12; H01L 39/126; H01L 39/14; H01L 39/143; Y02E 40/641; Y02E 40/642; C01G 3/00; H02K 3/30; H02K 3/32
USPC ......... 505/150, 211, 230, 236–238, 430, 704, 505/705, 813, 924; 174/110 SR, 110 R, 174/119 R, 125.1, 137 R, 137 B; 335/216; 29/599; 428/421, 422, 423.1, 423.3, 428/469, 472, 701, 702
See application file for complete search history.

(56) References Cited

U.S. PATENT DOCUMENTS 3,616,177 A * 10/1971 Gumerman ................. 428/216
5,252,383 A * 10/1993 Fukutake et al. ........... 428/209
(Continued)

FOREIGN PATENT DOCUMENTS

CN         1152275 A      6/1997
CN       101449341 A      6/2009
(Continued)

OTHER PUBLICATIONS

International Search Report for PCT/JP2013/065938 dated Jul. 23, 2013.
(Continued)

*Primary Examiner* — Paul Wartalowicz
(74) *Attorney, Agent, or Firm* — Sughrue Mion, PLLC (57) ABSTRACT

An oxide superconductor wire includes: a superconductor laminate that comprises a substrate which is formed in a tape shape and an intermediate layer, an oxide superconductor layer, and a metal stabilizing layer which are laminated on the substrate; and an insulating coating layer that covers an outside surface of the superconductor laminate, Also, either the entire outside surface or the entire inside surface of the insulating coating layer is coated with a coating layer formed of a fluororesin.

18 Claims, 5 Drawing Sheets

(51) Int. Cl.
*H01F 6/06* (2006.01)
*H01L 39/14* (2006.01)
*H01B 3/44* (2006.01)
H01B 3/30 (2006.01)
H01B 7/00 (2006.01)

(56) References Cited

U.S. PATENT DOCUMENTS

| | | | |
|---|---|---|---|
| 5,396,205 A | | 3/1995 | Takahashi et al. |
| 6,194,665 B1 * | | 2/2001 | Kuribayashi et al. ..... 174/120 R |
| 2001/0047879 A1 | | 12/2001 | Lakner et al. |
| 2004/0256140 A1 * | | 12/2004 | Schmidt ..................... 174/125.1 |
| 2008/0180202 A1 * | | 7/2008 | Otto et al. ..................... 335/284 |
| 2012/0122697 A1 * | | 5/2012 | Miyazaki et al. ............. 505/211 |
| 2013/0008688 A1 * | | 1/2013 | Nagai et al. ................ 174/119 R |

FOREIGN PATENT DOCUMENTS

| | | |
|---|---|---|
| CN | 102468029 A | 5/2012 |
| EP | 1454738 A2 | 9/2004 |
| EP | 2220656 A2 | 8/2010 |
| GB | 2485480 A | 5/2012 |
| JP | 1-109612 A | 4/1989 |
| JP | 2-44613 A | 2/1990 |
| JP | 2007-280710 A | 10/2007 |
| JP | 2008-243588 A | 10/2008 |
| JP | 2010-267550 A | 11/2010 |
| JP | 2010-267822 A | 11/2010 |
| JP | 2010-267835 A | 11/2010 |
| JP | 2011-113933 A | 6/2011 |
| JP | 2011-198469 A | 10/2011 |
| JP | 2012-216504 A | 11/2012 |
| RU | 2109361 C1 | 4/1998 |
| RU | 2279727 C2 | 7/2006 |
| WO | 0033393 A1 | 6/2000 |

OTHER PUBLICATIONS

Notice of Allowance issued by Japanese Patent Office Action in Japanese Application No. 2013-556919 mailed Feb. 12, 2014.
Office Action issued by Chinese Patent Office in Chinese Application No. 201380002549.8 mailed Aug. 19, 2014.
Communication dated Oct. 27, 2015 from the Russian Patent Office in counterpart application No. 2014143988/07.
Communication dated Apr. 9, 2014 from the Korean Intellectual Property Office in counterpart application No. 10-2013-7033542.
Communication dated Aug. 25, 2015 from the State Intellectual Property Office of the People's Republic of China in counterpart application No. 201380002549.8.
Communication dated Aug. 17, 2015 from the New Zealand Intellectual Property Office in counterpart application No. 620910.
Communication dated Mar. 9, 2015 from the State Intellectual Property Office of the People's Republic of China in counterpart application No. 201380002549.8.
Communication dated Jan. 27, 2015, issued by the European Patent Office in corresponding European Application No. 13804249.4.
Communication dated Mar. 24, 2016 from the State Intellectual Property Office of the P.R.C. in counterpart Application No. 201380002549.8.

* cited by examiner

OXIDE SUPERCONDUCTOR WIRE AND SUPERCONDUCTING COIL

CROSS REFERENCE TO RELATED APPLICATIONS

This application is a continuation in part application based on a PCT Patent Application No. PCT/JP2013/065938, filed Jun. 10, 2013, whose priority is claimed on Japanese Patent Application No. 2012-131927, filed Jun. 11, 2012, the entire content of which are hereby incorporated by reference.

BACKGROUND OF THE INVENTION

1. Field of the Invention

The present invention relates to an oxide superconductor wire and a superconducting coil.

2. Description of the Related Art

A metal superconductor wire such as NbTi which is used in the conventional art is provided, for example, in round or angular form, and the degree of freedom for the shape thereof is high.

On the other hand, in an oxide superconductor of Bi (bismuth), Y (yttrium), or the like in which a critical temperature is approximately 90 K to 100 K, an oxide superconductor layer is formed of a ceramic.

In addition, it is preferable that the structure of a wire formed of such an oxide superconductor have a tape shape having a high aspect ratio.

An oxide superconductor layer is formed of one kind of ceramics.

A superconductor wire of a rare earth oxide which is known as an yttrium-based oxide has a structure in which multiple thin films are laminated on a metal substrate provided as a tension member.

For example, an oxide superconductor wire of a rare earth oxide has a structure in which an oxide superconductor layer is laminated on a tape-shaped metal substrate through an intermediate layer having a controlled crystal orientation, and a stabilizing layer formed of a high-conductivity material such as Cu is laminated on the oxide superconductor layer.

Using the above-described rare earth oxide-based superconductor wire, a superconducting coil is manufactured.

In addition, after coiling the tape-shaped oxide superconductor wire, the coil is hardened with an impregnating resin to improve the strength of the superconducting coil.

However, the metal substrate which is applied to the oxide superconductor wire is formed of a nickel alloy which is useful as a tensile member, for example, HASTELLOY (trade name, manufactured by Haynes International Inc.), and the stabilizing layer is formed of a high-conductivity material such as Cu.

In contrast, the impregnating resin surrounding the coil is formed of a resin.

Therefore, stress is generated due to a difference in linear expansion coefficient or a difference in shrinkage ratio between these materials.

For example, since the superconducting coil is cooled to a liquid nitrogen temperature or lower and used at a low temperature, the linear expansion coefficients of these materials are non-linear.

Therefore, when a comparison is performed using a shrinkage ratio in which a ratio of the length at room temperature to the length at a low temperature is represented by a percentage, a peel stress is applied in a thickness direction of the superconductor wire during cooling.

Therefore, when a superconducting coil is prepared and has a resin-impregnated structure, a peel stress is applied in a thickness direction of a superconductor wire during cooling.

As a result, after forming the superconducting coil, superconductivity may deteriorate.

In order to avoid this peel stress problem caused by a difference in shrinkage ratio, Japanese Unexamined Patent Application, First Publication No. 2011-198469 discloses a technique of coating the entire circumferential surface of a superconductor wire with an insulating coating layer and forming a release material layer on only part of a surface of the insulating coating layer.

Figure 9:
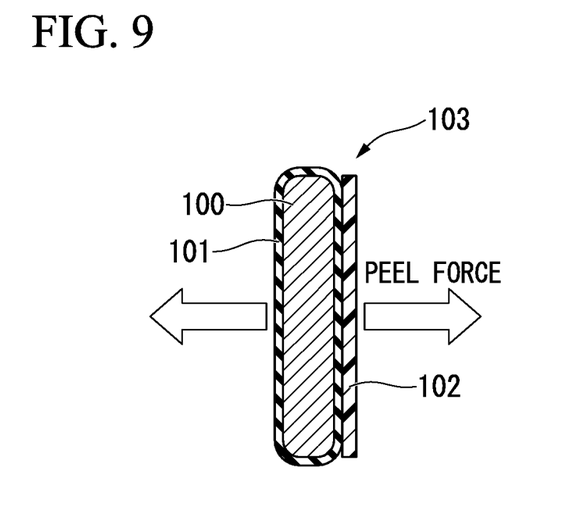
FIG. 9 is a cross-sectional view illustrating a stress load state on a superconductor wire of the conventional art including a release layer.

FIG. 9 illustrates a superconductor composite wire 103 disclosed in Japanese Unexamined Patent Application, First Publication No. 2011-198469 in which the entire circumference of an oxide superconductor wire 100 formed of a rectangular material is coated with an insulating material layer 101, and a release material layer 102 is provided along one surface of the insulating material layer 101.

Figure 10:
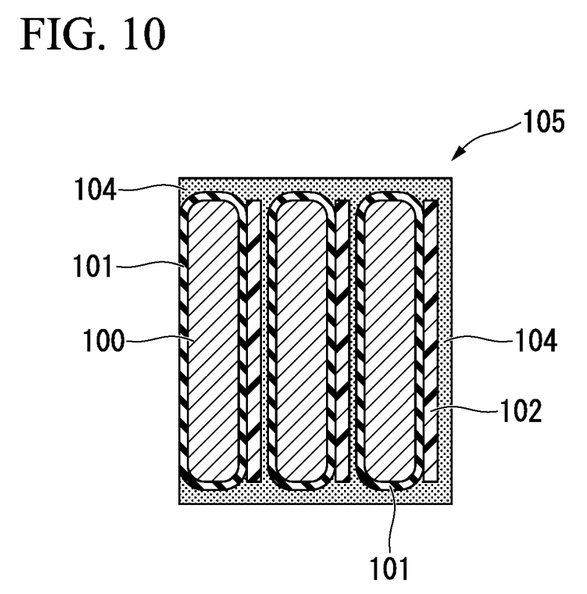
FIG. 10 is a cross-sectional view illustrating part of an example of a superconducting coil which is formed using the superconductor wire of FIG. 9 including the release layer.

In addition, Japanese Unexamined Patent Application, First Publication No. 2011-198469 discloses a superconducting coil 105 which is formed by coiling the superconductor composite wire 103 illustrated in FIG. 9 and then hardening the obtained coil with a cured resin layer 104 illustrated in FIG. 10 which is impregnated and cured with a thermosetting synthetic resin such as an epoxy resin.

Japanese Unexamined Patent Application, First Publication No. 2011-198469 discloses the fact that the insulating material layer 101 is formed of polyesters or polyurethanes and the fact that the release material layer 102 is formed of waxes, silicone oils, or various resins.

In addition, Japanese Unexamined Patent Application, First Publication No. 2010-267835 discloses a coiling technique of lap-winding, when a superconductor wire is wound and coiled, an insulating tape around a tape-shaped superconductor wire.

It can be presumed that the techniques disclosed in PATENT Japanese Unexamined Patent Application, First Publication No. 2011-198469 and Japanese Unexamined Patent Application, First Publication No. 2010-267835 are effective for cases where the superconductivity of a superconducting coil may deteriorate due to a peel stress which is applied in the thickness direction of a superconductor wire during the cooling of the superconducting coil.

However, when a superconductor wire is formed in a coil shape, it is necessary that the release material layer 102 be newly formed. Therefore, the number of processes during coiling is increased.

In addition, in the technique disclosed in Japanese Unexamined Patent Application, First Publication No. 2011-198469, the thickness of the release material layer 102 is not disclosed. However, when the release material layer 102 is thick, an occupancy ratio of the release material layer 102 in a cross-sectional area of the superconducting coil is increased, and an exclusive area of the superconductor wire is decreased correspondingly.

Therefore, it is considered that the thickness of the release material layer 102 is preferably less than or equal to approximately 10 μm.

However, from the viewpoint of coiling workability, it is difficult to wind the release material layer 102 having a thickness of approximately 10 μm or less along with the superconductor wire during coiling.

In addition, when a method of uniformly forming the release material layer 102 having a thickness of 10 μm or less is not found, thick portions and thin portions are mixed in the release material layer 102.

As a result, strain caused by peel stress may be locally concentrated on a part of the superconducting coil.

Accordingly, it is considered that the superconductor wire may deteriorate.

The present invention has been made in consideration of such circumstances of the conventional art, and an object thereof is to provide an oxide superconductor wire having a structure in which the application of stress to the superconductor wire is suppressed when a superconducting coil is used in a cooled state and having a structure in which deterioration in superconductivity is suppressed; and a superconducting coil which is formed using the oxide superconductor wire.

SUMMARY

In order to solve the above-described problem, according to a first aspect of the present invention, there is provided an oxide superconductor wire including: a superconductor laminate that includes a substrate which is formed in a tape shape and an intermediate layer, an oxide superconductor layer, and a metal stabilizing layer which are laminated on the substrate; and an insulating coating layer that covers an outside surface of the superconductor laminate. Also, either the entire outside surface or the entire inside surface of the insulating coating layer is coated with a coating layer formed of a fluororesin.

When the oxide superconductor wire includes the coating layer formed of a fluororesin, in a case where the outside surface of the oxide superconductor wire is covered with an impregnating resin, an adhesive force between the coating layer and the impregnating resin can be reduced.

As a result, when the oxide superconductor layer is used in the superconducting state by cooling the oxide superconductor layer, stress generated by the shrinkage of the impregnating resin can be released by delamination at the interface between coating layer and the impregnating resin.

That is, peel force applied in a thickness direction of the oxide superconductor laminate can be suppressed.

Therefore, it is possible to provide an oxide superconductor wire in which deterioration in superconductivity is suppressed when being used in a cooled state.

In addition, it is preferable that both the entire outside surface and the entire inside surface of the insulating coating layer be coated with the coating layer.

In addition, it is preferable that the insulating coating layer be formed by winding an insulating tape around the superconductor laminate, the insulating tape being coated with the coating layer.

When the coating layer is formed on both the inside surface and the outside surface of the insulating coating layer, a sliding property can be imparted to the interface between the superconductor laminate and the insulating coating layer, in addition to the above-described stress relaxation effect obtained when the outside surface is covered with the impregnating resin.

Accordingly, part of the stress which is applied to the superconductor laminate can also be released using the coating layer formed on the inside surface.

In addition, a case is assumed where the insulating coating layer is formed by winding the insulating tape around the outside surface of the superconductor laminate. In this case, when the insulating coating layer is wound around the outside surface of the superconductor laminate and is aligned using a winding device and a winding jig, even if metal portions of the winding device and the winding jig rub against the insulating tape, the winding operation and end surface alignment can be performed without the insulating tape being cut.

Therefore, with the above-described configuration, it is possible to provide an oxide superconductor wire including the insulating coating layer that is formed of the insulating tape having no irregular winding, no ruptured portions, and few defects.

In addition, it is preferable that at least one sheet of the insulating tape be wound around the superconductor laminate so as to cover the entire outside surface thereof.

In addition, it is preferable that the thickness of the coating layer be 1 to 10 μm.

When the coating layer is formed of a fluororesin by dipping, the coating layer having a thickness, which is a fraction of the thickness of the insulating coating layer, for example, is approximately 1 to 10 μm, can be uniformly formed using a fluororesin.

Therefore, when the oxide superconductor wire is formed in a coil shape to form a superconducting coil, an occupancy ratio of the coating layer in a cross-sectional area of the coil can be reduced, and an area ratio of the oxide superconductor layer in a cross-sectional area of the oxide superconductor laminate can be secured at a high ratio.

Therefore, deterioration in current density caused by providing the coating layer can be suppressed.

In addition, when the coating layer is formed by dipping, the thickness thereof can be simply made uniform.

Therefore, the possibility that stress may be concentrated on portions of the coating layer having a non-uniform thickness is also reduced.

When the thickness of the coating layer formed by dipping is in a range of 1 to 10 μm, the thickness of the coating layer is uniform, which is advantageous in terms of cost.

In addition, it is possible to provide an oxide superconductor wire including the insulating layer where there are no cut or ruptured portions when the oxide superconductor wire rubs against metal portions of devices for handling the wire.

In addition, when the insulating coating layer includes the coating layer, which is formed by dipping, on both inside and outside surfaces thereof, even if there is a pin hole on the insulating coating layer, the coating layers on both surfaces can bury the pin hole, thereby forming the coating layer with no defects.

According to a second aspect of the present invention, there is provided a superconducting coil including a coil body that is formed by winding the oxide superconductor wire according to the first aspect therearound.

According to a third aspect of the present invention, there is provided a superconducting coil including a coil body that is formed by winding the oxide superconductor wire according to the first aspect, in which a ratio of an outer diameter of the superconducting coil to an inner diameter of the superconducting coil is higher than or equal to 2.

It is preferable that the coil body be covered with an impregnating resin.

A case is assumed where the superconducting coil includes the coating layer of a fluororesin that is formed on the outside surface of the oxide superconductor wire, and an impregnating resin layer is provided on the outside of the coating layer.

In this case, when the superconducting coil is used by cooling to below a critical temperature of the superconductor layer, even if stress is applied to the oxide superconductor wire in a delamination direction due to the shrinkage of the impregnating resin layer caused by cooling, peeling occurs at the interface between the coating layer and the impregnating resin, and the stress is released.

Accordingly, the stress which is applied to the oxide superconductor wire can be released.

Therefore, it is possible to provide a superconducting coil in which deterioration in superconductivity does not occur during cooling.

According to the above-described aspects of the present invention, the coating layer formed of a fluororesin is formed on the entire outside surface of the insulating coating layer that covers the entire outside surface of the superconductor laminate.

Accordingly, when the outside surface of the superconducting coil is covered with the impregnating resin, an adhesive force between the coating layer and the impregnating resin can be reduced.

As a result, when the oxide superconductor layer is used in the superconducting state by cooling the oxide superconductor layer, stress generated by the shrinkage force of the impregnating resin can be released by delamination at the interface between coating layer and the impregnating resin.

That is, a peel force applied in a thickness direction of the oxide superconductor laminate can be suppressed.

Therefore, when the superconducting coil is formed of the oxide superconductor wire, is hardened with the impregnating resin, and is used in a cool state, it is possible to provide the oxide superconductor wire in which deterioration in superconductivity is suppressed.

DETAILED DESCRIPTION OF THE PREFERRED EMBODIMENTS

Hereinafter, an oxide superconductor wire and a superconducting coil according to embodiments of the present invention will be described based on the drawings.

First Embodiment

Figure 1:
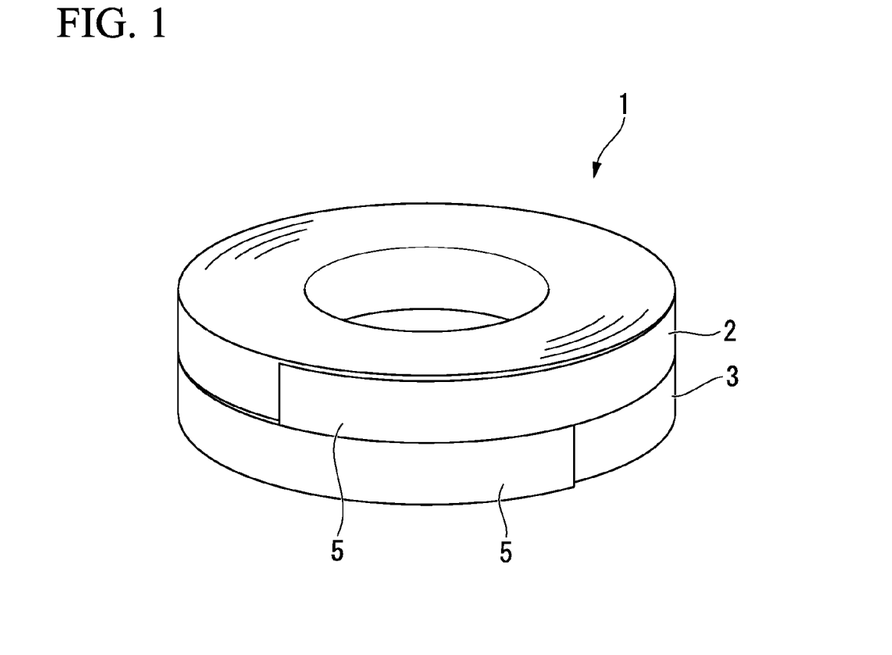
FIG. 1 is a perspective view illustrating an example of a structure of a superconducting coil which is formed using an oxide superconductor wire according to a first embodiment of the present invention.

FIG. 1 illustrates a superconducting coil 1 which is formed by winding an oxide superconductor wire according to a first embodiment of the present invention. In this example, the superconducting coil 1 is formed as a two-layer pancake coil in which a pancake coil body 2 on an upper side and a pancake coil body 3 on a lower side are laminated.

Figure 2:
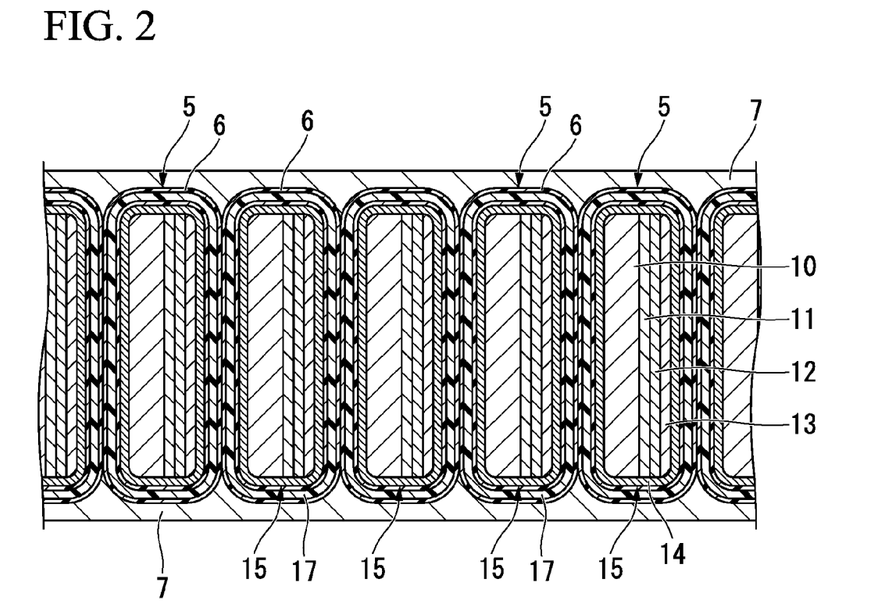
FIG. 2 is a cross-sectional view schematically illustrating part of the superconducting coil illustrated in FIG. 1.

Each of the coil bodies 2 and 3 is formed by winding a tape-shaped oxide superconductor wire 5 having a cross-sectional structure illustrated in FIG. 2 in a spiral shape such that one surface thereof is an inside surface and the other surface is an outside surface.

In the example of FIG. 1, the coil body 2 on the upper side is formed by winding the oxide superconductor wire 5 clockwise, and the coil body 3 on the lower side is formed by winding the oxide superconductor wire 5 counterclockwise.

In addition, as illustrated in FIG. 2, the oxide superconductor wire 5 is provided with a coating layer 6 described below on the outside surface.

The outside surface of each of the coil bodies 2 and 3 is covered with an impregnating resin 7 having a predetermined thickness.

However, in FIG. 1, the impregnating resin 7 which is provided on the outside surface is not illustrated, and only each of the coil bodies 2 and 3 is illustrated.

Figure 3:
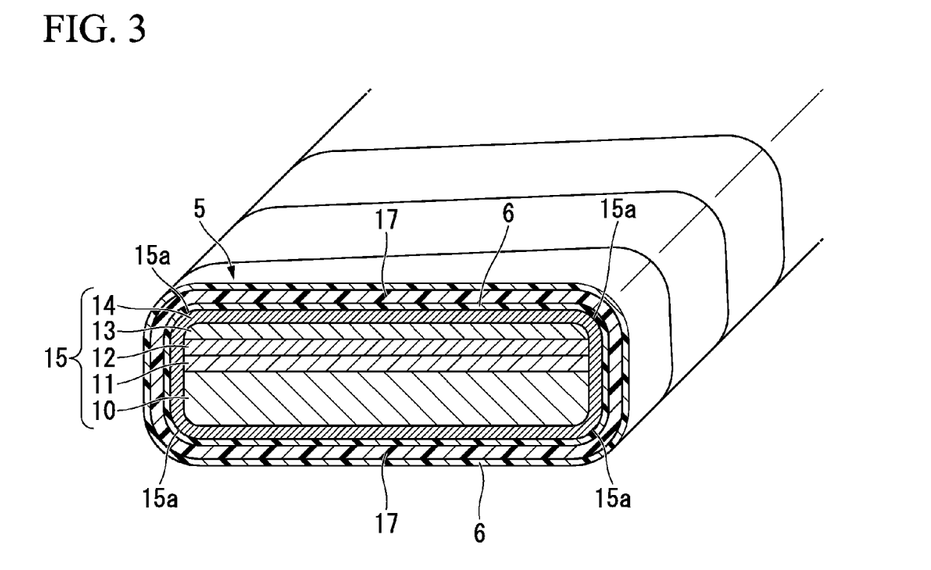
FIG. 3 is a cross-sectional view illustrating the oxide superconductor wire according to the first embodiment which is applied to the superconducting coil illustrated in FIG. 1.

In the oxide superconductor wire 5 having a cross-sectional structure illustrated in FIGS. 2 and 3, an intermediate layer 11, an oxide superconductor layer 12, a first metal stabilizing layer 13, and a second metal stabilizing layer 14 are formed on one surface of a tape-shaped substrate 10 to form a superconductor laminate 15.

Further, an insulating coating layer 17 is formed so as to cover the entire outside surface of the superconductor laminate 15, and the coating layer 6 is formed on both inside and outside surfaces of the insulating coating layer 17.

The first metal stabilizing layer 13 is formed on the oxide superconductor layer 12.

The second metal stabilizing layer 14 is formed so as to cover the entire outside surface of a structure in which the substrate 10, the intermediate layer 11, the oxide superconductor layer 12, and the metal stabilizing layer 13 are laminated.

Further, the insulating coating layer 17 is formed so as to cover the outer circumference of the second stabilizing layer 14.

In this embodiment, the insulating coating layer 17 includes the coating layer 6 which is formed on both the inside and outside surfaces of the insulating coating layer 17.

However, the coating layer 6 may be formed on either the outside surface or the inside surface of the insulating coating layer 17.

In addition, on a lateral surface of the insulating coating layer 17, the coating layer 6 is not necessarily formed.

In this specification, the outside surface refers to a surface of each layer (element) which is distant from the substrate, and the inside surface refers to a surface of each layer (element) which is close to the substrate.

Typically, the substrate 10 is not particularly limited as long as it can be used as a substrate of the superconductor wire.

It is preferable that the substrate have a flexible tape shape and be formed of a heat-resistant metal.

Among heat-resistant metals, a nickel (Ni) alloy is preferable.

Among nickel alloys, HASTELLOY (trade name, manufactured by Haynes International Inc.) is preferable as a commercially available product.

For example, any one of HASTELLOY B, C, G, N, and W having different amounts of elements such as molybdenum (Mo), chromium (Cr), iron (Fe), and cobalt (Co) can be used.

In addition, an oriented metal substrate in which a texture is incorporated into a nickel alloy or the like may be used as the substrate 10, and the intermediate layer 11 and the oxide superconductor layer 12 may be formed on the oriented metal substrate.

It is preferable that the thickness of the substrate 10 be appropriately adjusted according to the purpose.

Typically, the thickness is preferably 10 to 500 μm and more preferably 20 to 200 μm.

The intermediate layer 11 functions as a buffer layer for alleviating a difference in physical properties (for example, thermal expansion coefficient and lattice constant) between the substrate 10 and the oxide superconductor layer 12 which is formed on the intermediate layer 11.

It is preferable that the intermediate layer 11 be a metal oxide having intermediate values of physical properties between the substrate 10 and the oxide superconductor layer 12.

Specific examples of the metal oxide which can be used as the intermediate layer 11 include $Gd_2Zr_2O_7$, MgO, $ZrO_2$—$Y_2O_3$(YSZ), $SrTiO_3$, $CeO_2$, $Y_2O_3$, $Al_2O_3$, $Gd_2O_3$, $Zr_2O_3$, $Ho_2O_3$, and $Nd_2O_3$.

The intermediate layer 11 may be a single layer or multiple layers.

When the intermediate layer 11 is multi-layered, it is preferable that at least an outermost layer (layer which is closest to the oxide superconductor layer 12) have the same crystal orientation as that of a single crystal.

The intermediate layer 11 may have a multilayer structure in which a bed layer is provided on a side where the substrate 10 is provided.

The bed layer is optionally provided and, for example, is formed of yttria ($Y_2O_3$), silicon nitride ($Si_3N_4$), or aluminum oxide ($Al_2O_3$, also referred to as "alumina").

The thickness of the bed layer is, for example, 10 to 200 nm.

Furthermore, in the present embodiments, the intermediate layer 11 may have a multilayer structure in which a diffusion prevention layer and the bed layer are laminated on the substrate 10.

In this case, the diffusion prevention layer is interposed between the substrate 10 and the bed layer.

The diffusion prevention layer has a single-layer or multilayer structure which is formed of, for example, silicon nitride ($Si_3N_4$), aluminum oxide ($Al_2O_3$), or a rare earth metal oxide, and the thickness thereof is, for example, 10 to 400 nm.

The intermediate layer 11 may have a multilayer structure in which a cap layer is further laminated on the above-described metal oxide layer.

The cap layer has a function of controlling the orientation of the oxide superconductor layer 12.

The cap layer is not particularly limited, and is preferably formed of $CeO_2$, $Y_2O_3$, $Al_2O_3$, $Gd_2O_3$, $Zr_2O_3$, $Ho_2O_3$, and $Nd_2O_3$.

When the material of the cap layer is $CeO_2$, the cap layer may contain a Ce-M—O-based oxide in which part of Ce is substituted with other metal elements or other metal ions.

To the oxide superconductor layer 12, an oxide superconductor having a well-known composition as a superconductor wire can be widely applied, and examples thereof include $REBa_2Cu_3O_y$ (RE represents a rare earth element such as Y, La, Nd, Sm, Er, or Gd), specifically, Y123 ($YBa_2Cu_3O_y$) or Gd123 ($GdBa_2Cu_3O_y$).

In addition, it is needless to say that other oxide superconductors, for example, an oxide superconductor having a high critical temperature which is represented by the composition $Bi_2Sr_2Ca_{n-1}Cu_nO_{4+2n+\delta}$ can be used.

The thickness of the oxide superconductor layer 12 is approximately 0.5 to 5 μm and is preferably uniform.

The first metal stabilizing layer 13 which is laminated on the oxide superconductor layer 12 is formed of a metal material, such as Ag or an Ag alloy, which has high conductivity and has a low contact resistance and a high compatibility with the oxide superconductor layer 12.

The reason why Ag is used as a material for forming the first metal stabilizing layer 13 is that, for example, in an annealing process of doping the oxide superconductor layer 12 with oxygen, Ag has a property of suppressing the escape of the doped oxygen from the oxide superconductor layer 12.

When the first metal stabilizing layer 13 is formed of Ag, it is preferable that a film forming method such as a sputtering method be used and that the thickness of the first metal stabilizing layer 13 be approximately 1 to 30 μm.

The second metal stabilizing layer 14 is formed of a high-conductivity metal material.

When the oxide superconductor layer 12 is switched from the superconducting state to the normal conducting state, the second metal stabilizing layer 14 functions as a bypass for commutating a current of the oxide superconductor layer 12 along with the first metal stabilizing layer 13.

A metal material for forming the second metal stabilizing layer 14 is not particularly limited as long as it has high conductivity.

A relatively cheap material is preferable, for example, copper, brass (Cu—Zn alloy), a copper alloy such as Cu—Ni alloy, or stainless steel.

Among these, copper is more preferable from the viewpoints of high conductivity and cheapness.

When the superconductor wire is used for a superconducting fault current limiter, the second metal stabilizing layer 14 is formed of a resistance metal material, and, for example, a Ni-based alloy such as Ni—Cr may be used.

A method of forming the second metal stabilizing layer 14 is not particularly limited.

For example, by forming a plating layer using a high-conductivity wire such as copper, the second metal stabilizing layer 14 can be formed so as to cover the entire circumference of the superconductor laminate in which the intermediate layer 11, the oxide superconductor layer 12, and the first stabilizing layer 13 are formed on the substrate 10.

In addition, it is possible to adopt a structure in which the second metal stabilizing layer 14 is formed on only the first metal stabilizing layer 13 using a Cu tape or the like, or a structure in which the second metal stabilizing layer 14 is formed using a Cu tape so as to cover the entire circumference of the laminate.

These structures will be described in a second embodiment using FIG. 4 or in a third or subsequent embodiment using FIG. 5.

The thickness of the second metal stabilizing layer 14 can be appropriately adjusted without being particularly limited.

For example, the thickness is preferably 10 to 300 μm.

The insulating coating layer 17 which covers the outer circumference of the second metal stabilizing layer 14 can be formed by winding an insulating resin tape around the entire outer circumference of the superconductor laminate 15 or by coating the entire outer circumference of the superconductor laminate 15 with a resin and then baking the resultant.

The upper limit of the thickness of the insulating coating layer 17 is not particularly limited, but is preferably less than or equal to 100 μm.

By controlling the thickness of the insulating coating layer 17 to be less than or equal to 100 μm, an occupancy ratio of the insulating coating layer 17 in a cross-sectional area of the superconductor laminate 15 can be reduced.

Accordingly, the size of the oxide superconductor wire 5 can be reduced.

In addition, when the oxide superconductor wire 5 is coiled, an overall current density can be increased.

For example, when the insulating coating layer 17 is formed by the winding of an insulating tape, the insulating tape having a thickness in a range of 5 to 20 μm can be used.

In addition, when the insulating tape is wound around the second metal stabilizing layer 14, it is preferable that at least one sheet of the insulating tape be butt-wound or lap-wound so as to cover the entire outer circumferential surface of the superconductor laminate 15.

In addition, butt-winding capable of winding a tape without lapping the tape is more preferable because the thickness of the insulating layer can be reduced.

Butt-winding refers to a method of winding a tape around the superconductor laminate by making edges of the tape in a width direction thereof abut each other such that the edges do not overlap each other.

Lap-winding refers to a method of winding a tape around the superconductor laminate such that edges of the tape in a width direction thereof overlap each other by, for example, approximately ½ of the width of the tape.

It is preferable that four corner portions 15a in a cross-section of the superconductor laminate 15 be curved portions.

By forming the corner portions 15a of the superconductor laminate 15 in a curved shape, when the insulating coating layer 17 is formed by an insulating tape, the insulating tape can be wound around the corner portions having an acute angle without being cut.

In addition, when the insulating coating layer 17 is a layer formed by baking a resin solution, the corner portions 15a can be coated with the resin solution having a desired thickness.

Then, after baking, the insulating coating layer 17 having a desired thickness can be formed even on the outside surfaces of the corner portions 15a.

The insulating coating layer 17 can be formed by winding an insulating tape of a resin such as polyimide, polyamide, polyamidimide, polyurethane, polyester, polyvinyl butyral, or polyvinyl formal, or by winding a glass tape.

When the insulating coating layer 17 is a baked resin layer, for example, baked resin layers of formal resins, urethane resins, polyimide resins, polyamidimide resins, polyester resins, polyether ether ketone resins (PEEK resins), or enamel resins can be used.

In the oxide superconductor wire 5 according to this embodiment, both the inside and outside surfaces of the insulating coating layer 17 are covered with a coating layer 6 formed of a fluororesin.

For example, the coating layer 6 can be obtained by coating a coating material containing a fluororesin on a desired position at a desired thickness and drying the coating material.

Examples of the fluororesin which can be used include PTFE (polytetrafluoroethylene), FEP (tetrafluoroethylene-hexafluoropropylene copolymer), PFA (perfluoroalkoxy fluororesin), and ETFE (ethylene-tetrafluoroethylene copolymer).

Optionally, an organic binder or the like is added to the fluororesin to form a coating material of the fluororesin, and, by coating this coating material on a desired position and drying the coating material, the coating layer 6 having a thickness of approximately 1 to 10 μm can be formed.

In addition, as a method of coating the coating material containing the fluororesin, a well-known coating method such as a dipping method, a spray coating method, a roll coating method, or a spin flow coating method can be used.

According to a dipping method among these methods, when the insulating coating layer 17 is formed by an insulating tape, the coating layer 6 having a uniform thickness of 1 to 10 μm can be easily formed on either the inside surface or the outside surface of the insulating tape.

From the viewpoint of easiness of the formation of the coating layer, the coating layer may be provided on both the inside and outside surfaces of the resin tape.

When the thickness of the coating layer 6 formed on one surface of the resin tape is less than 1 μm, in other words, when the total thickness of the coating layers on both the inside and outside surfaces of the resin tape is less than or equal to 2 μm, the uniformity of the coating layer 6 cannot be secured, and a sea-island structure is formed.

Therefore, it is preferable that the thickness of the coating layer 6 on each surface of the resin tape be at least 1 μm.

In addition, the greater the thickness of the coating layer 6, the higher the cost.

Therefore, it is preferable that the thickness of a single surface be less than or equal to 10 μm and that the total thickness of both the surfaces be less than or equal to 20 μm.

When the insulating coating layer 17 is formed by winding a resin tape, the insulating coating layer 17 including the coating layer 6 can be formed by forming the coating layer 6 on the resin tape using a dipping method or the like; and butt-winding or lap-winding the resin tape, on which the coating layer is formed, around the outside surface of the superconductor laminate 15.

In addition, in a case where the insulating coating layer 17 is formed using a baked resin layer, after the insulating coating layer 17 is formed using the baked resin layer, the coating layer 6 may be formed on the outside surface of the insulating coating layer 17 using a coating method such as a dipping method.

When the insulating coating layer 17 has the above-described thickness, there is a concern that a pin hole may be formed.

On the other hand, when the insulating coating layer 17 has a structure in which both surfaces thereof are covered with the coating layer 6 by dipping, a pin hole can be reliably buried.

As a result, the circumferential surface of the superconductor laminate 15 can be covered with the insulating coating layer 17 having no pin holes.

A coil is prepared by winding the oxide superconductor wire 5, which includes the coating layer 6 on the outermost surface thereof, clockwise, and a coil is prepared by winding the oxide superconductor wire 5 counterclockwise.

These coils are vertically combined to obtain a two-layer pancake coil.

Next, a desired number of two-layer pancake coils are laminated on a winding frame, and the obtained laminate is impregnated and fixed with an epoxy resin using a method such as vacuum impregnating such that the entire portion thereof is covered.

As a result, a cross-sectional structure illustrated in FIG. 2 is obtained, and the superconducting coil 1 including the coil bodies 2 and 3 which are covered with the impregnating resin 7 can be obtained.

This superconducting coil 1 is used by cooling to critical temperature of the superconductor layer 12 or lower, for example, a liquid nitrogen temperature (77 K) or lower.

For cooling, the superconducting coil 1 may be cooled by dipping the superconducting coil 1 in liquid nitrogen, or by accommodating the superconducting coil 1 in an insulating container including a refrigerator.

The oxide superconductor layer 12 is in the superconducting state after being cooled to the critical temperature or lower.

Therefore, a current can flow through the oxide superconductor layer 12.

When being applied to a superconducting magnet, for example, this superconducting coil 1 can be used for generating a magnetic force.

Since the superconducting coil 1 is provided at room temperature before being used in a cooled state, the superconducting coil 1 is cooled from room temperature to a temperature range of a liquid nitrogen temperature or lower.

Since most area of a cross-sectional surface of the oxide superconductor wire 5 is occupied by the metal substrate 10 and the stabilizing layer 14, the oxide superconductor wire 5 has a thermal expansion coefficient which is approximately close to that of the metal.

On the other hand, the impregnating resin 7 is a resin and has a linear expansion coefficient which is greater than that of the metal.

Therefore, when the superconducting coil 1 is cooled, stress is applied to the oxide superconductor wire 5 due to the thermal expansion of the impregnating resin 7 caused by cooling.

The coating layer 6 formed of a fluororesin is formed on the outside surface of the oxide superconductor wire 5, and an adhesive strength at the interface between the coating layer 6 and the impregnating resin 7 is not that high.

Accordingly, when the above-described stress is applied, delamination occurs at the interface between the coating layer 6 and the impregnating resin 7.

Part of the above-described stress is released by this delamination.

As a result, stress which induces delamination in the oxide superconductor wire 5 can be eliminated or suppressed.

Therefore, when the superconducting coil 1 is used in a cooled state, deterioration in superconductivity is suppressed.

In particular, when a ratio (coil outer diameter/coil inner diameter) of an outer diameter of the superconducting coil 1 to an inner diameter thereof is higher than or equal to 2, it is preferable that at least one sheet of the insulating tape (insulating coating layer 17) be butt-wound so as to cover the entire outside surface of the superconductor laminate 15 because deterioration in superconductivity is suppressed.

Second Embodiment

Figure 4:
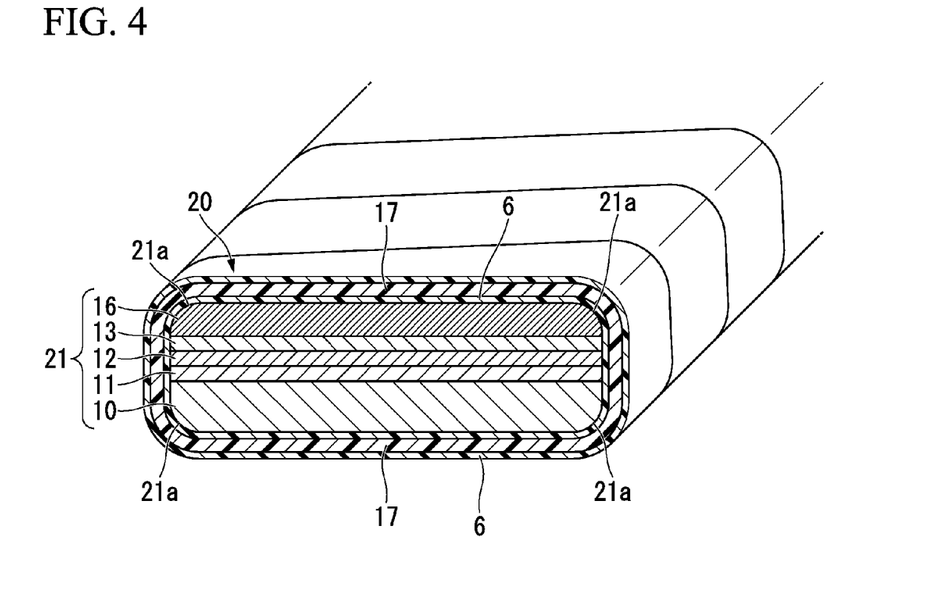
FIG. 4 is a cross-sectional perspective view illustrating part of an oxide superconductor wire according to a second embodiment of the present invention which is applied to the superconducting coil illustrated in FIG. 1.

FIG. 4 is a cross-sectional perspective view illustrating part of an oxide superconductor wire for forming a superconducting coil according to a second embodiment of the present invention.

An oxide superconductor wire 20 having a cross-sectional structure illustrated in FIG. 4 includes a superconductor laminate 21 that is formed by laminating the intermediate layer 11, the oxide superconductor layer 12, the first metal stabilizing layer 13, and a second metal stabilizing layer 16 on one surface of the tape-shaped substrate 10; the insulating coating layer 17 that is provided with a coating layer and is formed so as to cover the entire outside surface of the superconductor laminate 21; and the coating layer 6 that is formed on both inside and outside surfaces of the insulating coating layer 17.

In addition, the first metal stabilizing layer 13 is laminated on only the oxide superconductor layer 12, and the second metal stabilizing layer 16 is laminated on only the first stabilizing layer 13.

Further, the insulating coating layer 17 including the coating layer 6 is formed so as to cover the entire circumference of the superconductor laminate 21.

In this embodiment, the coating layer 6 is formed on both the inside and outside surfaces of the insulating coating layer 17. However, the coating layer 6 may be formed on only the outside surface of the insulating coating layer 17.

The oxide superconductor wire 20 according to this embodiment is different from the oxide superconductor wire 5 according to the first embodiment, in that the second metal stabilizing layer 16 is formed on only the first metal stabilizing layer 13, but the other configurations thereof are the same.

In the oxide superconductor wire 20 illustrated in FIG. 4, the same components as those of the oxide superconductor wire 5 illustrated in FIGS. 2 and 3 are represented by the same reference numerals, and the description thereof will not be repeated.

When the oxide superconductor layer 12 is switched from the superconducting state to the normal conducting state, the second metal stabilizing layer 16 functions as a bypass for commutating a current of the oxide superconductor layer 12 along with the first metal stabilizing layer 13.

The second metal stabilizing layer 16 is formed by integrally joining a metal tape, which is formed of, for example, Cu or a Cu alloy, onto the first metal stabilizing layer 13 using a conductive joining material such as a solder.

The solder, which can be used when the metal tape is laminated onto the first metal stabilizing layer 13 through the solder to form the second metal stabilizing layer 16, is not particularly limited, and a well-known solder of the conventional art can be used.

Examples of the solder include lead-free solders which are formed of Sn or alloys containing Sn as a major component such as an Sn—Ag alloy, an Sn—Bi alloy, an Sn—Cu alloy, or an Sn—Zn alloy; Pb—Sn alloy solders; eutectic solders; and low-temperature solders.

These solders can be used alone or in a combination of two or more kinds thereof.

Among these, solders having a melting point of 300° C. or lower are preferably used.

As a result, since the metal tape can be soldered to the first metal stabilizing layer 13 at a temperature of 300° C. or lower, deterioration in the properties of the oxide superconductor layer 12 by soldering heat can be suppressed.

The thickness of the second metal stabilizing layer 16 can be appropriately changed without being particularly limited.

For example, the thickness is preferably 10 to 300 μm.

In the oxide superconductor wire 20 illustrated in FIG. 4, similarly, corner portions 21a in a cross-section of the superconductor laminate 21 are corner portions having a curvature radius.

As a result, when the insulating coating layer 17 is formed using an insulating tape, an effect of, for example, preventing the insulating tape from being cut is exhibited.

From this point of view, the second embodiment is similar to the first embodiment.

In this embodiment, a coil is prepared by winding the oxide superconductor wire 20, which includes the coating layer 6 on the outermost surface thereof, clockwise, and a coil is prepared by winding the oxide superconductor wire 20 counterclockwise.

These coils are vertically combined to obtain a two-layer pancake coil. Next, a desired number of two-layer pancake coils are laminated on a winding frame, and the obtained laminate is impregnated and fixed with an epoxy resin using a method such as vacuum impregnating such that the entire portion thereof is covered.

As a result, a superconducting coil having the same shape as that of the superconducting coil 1 described in the first embodiment can be obtained.

By cooling this superconducting coil to the critical temperature or lower to cause a current to flow therethrough, this superconducting coil can be used.

When this superconducting coil is used in a cooled state at the critical temperature or lower, stress is applied to the oxide superconductor wire 5 due to the thermal expansion of the impregnating resin 7 caused by cooling.

The coating layer 6 formed of a fluororesin is formed on the outside surface of the oxide superconductor wire 20, and an adhesive strength at the interface between the coating layer 6 and the impregnating resin 7 is not that high. Accordingly, when the above-described stress is applied, delamination occurs at the interface between the coating layer 6 and the impregnating resin 7. Part of the above-described stress is released by this delamination.

As a result, stress which induces delamination in the oxide superconductor wire 20 can be eliminated or suppressed.

Therefore, when the superconducting coil is used in a cooled state, deterioration in superconductivity is suppressed.

Third Embodiment

Figure 5:
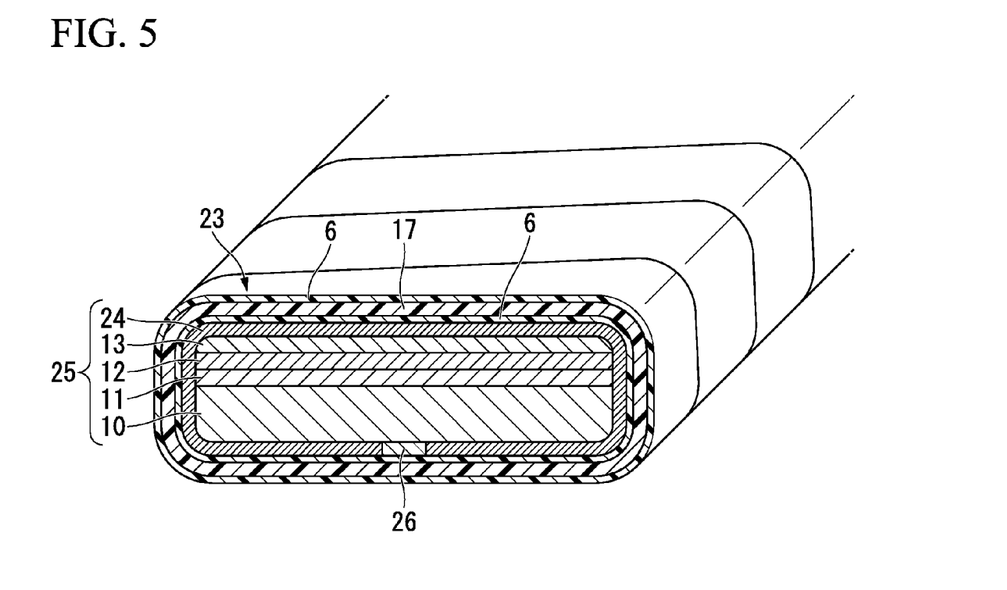
FIG. 5 is a cross-sectional perspective view illustrating part of an oxide superconductor wire according to a third embodiment of the present invention which is applied to the superconducting coil illustrated in FIG. 1.

FIG. 5 is a cross-sectional perspective view illustrating part of an oxide superconductor wire for forming a superconducting coil according to a third embodiment of the present invention.

An oxide superconductor wire 23 having a cross-sectional structure illustrated in FIG. 5 includes a superconductor laminate 25 that is formed by forming the intermediate layer 11, the oxide superconductor layer 12, and the first metal stabilizing layer 13 on one surface of the tape-shaped substrate 10 and forming a second metal stabilizing layer 24 so as to cover a circumference of the resultant; and the insulating coating layer 17 that is formed so as to cover the entire outside surface of the superconductor laminate 25.

In addition, the insulating coating layer 17 includes the coating layer 6, and the coating layer 6 is formed on both inside and outside surfaces of the insulating coating layer 17.

In this embodiment, the first metal stabilizing layer 13 is formed on only the oxide superconductor layer 12, and the second metal stabilizing layer 24 is formed so as to cover the entire circumference of the laminate in which the substrate 10, the intermediate layer 11, the oxide superconductor layer 12, and the first metal stabilizing layer 13 are laminated.

Further, the insulating coating layer 17 including the coating layer is formed so as to cover the outer circumference of the second metal stabilizing layer 24.

In this embodiment, the coating layer 6 is formed on both the inside and outside surfaces of the insulating coating layer 17.

However, the coating layer 6 may be formed on only the outside surface of the insulating coating layer 17.

In addition, since there is a case where both the inside and outside surfaces of the second metal stabilizing layer 24 may be subjected to solder plating, a solder layer may be formed even on the outside surface of the second metal stabilizing layer 24.

The second metal stabilizing layer 24 according to the second embodiment covers the circumference of the laminate (laminate in which the substrate 10, the intermediate layer 11, the oxide superconductor layer 12, and the first metal stabilizing layer 13 are laminated) so as to form a C-shape in cross-section, except for a center portion of the substrate 10 on the back side where the intermediate layer 11 is not formed.

The second metal stabilizing layer 24 is formed of the same material as that of the second metal stabilizing layer 14 according to the first embodiment.

For example, the second metal stabilizing layer 24 is formed by forming a metal tape using a roll or the like and coating the circumference of the laminate with the metal tape.

The center portion of the substrate 10 on the back side which is not covered with the second metal stabilizing layer 24 is covered with a solder layer 26.

The solder layer 26 is formed so as to bury a recessed portion formed by edges of the second stabilizing layer 14.

In the oxide superconductor wire 23 illustrated in FIG. 5, the same components as those of the oxide superconductor wire 5 illustrated in FIG. 1 are represented by the same reference numerals, and the detailed description thereof will not be repeated.

When the second metal stabilizing layer 24 is formed by forming a metal tape and coating the circumference of the laminate with the metal tape, it is preferable that the second metal stabilizing layer 24 be electrically and mechanically integrated using the conductive joining material such as a solder which is used for fixing the second metal stabilizing layer 16 in the above-described second embodiment.

In this embodiment, a coil is prepared by winding the oxide superconductor wire 23, which includes the coating layer 6 on the outermost surface thereof, clockwise, and a coil is prepared by winding the oxide superconductor wire 23 counterclockwise.

These coils are vertically combined to obtain a two-layer pancake coil.

Next, a desired number of two-layer pancake coils are laminated on a winding frame, and the obtained laminate is impregnated and fixed with an epoxy resin using a method such as vacuum impregnating such that the entire portion thereof is covered.

As a result, a superconducting coil having the same shape as that of the above-described superconducting coil 1 can be obtained.

By cooling this superconducting coil to the critical temperature or lower to cause a current to flow therethrough, the superconducting coil can be used while generating a magnetic force.

When this superconducting coil is used in a cooled state at the critical temperature or lower, stress is applied to the oxide superconductor wire 23 due to the thermal expansion of the impregnating resin 7 caused by cooling.

The coating layer 6 formed of a fluororesin is formed on the outside surface of the oxide superconductor wire 23, and an adhesive strength at the interface between the coating layer 6 and the impregnating resin layer is not that high.

Accordingly, when the above-described stress is applied, delamination occurs at the interface between the coating layer 6 and the impregnating resin layer.

Part of the above-described stress is released by this delamination.

As a result, stress which induces delamination in the oxide superconductor wire 23 can be eliminated or suppressed.

Therefore, when the superconducting coil is used in a cooled state, deterioration in superconductivity is suppressed.

That is, even in the structure according to the third embodiment, the same structure and effects as those of the first embodiment can be obtained.

Fourth Embodiment

Figure 6:
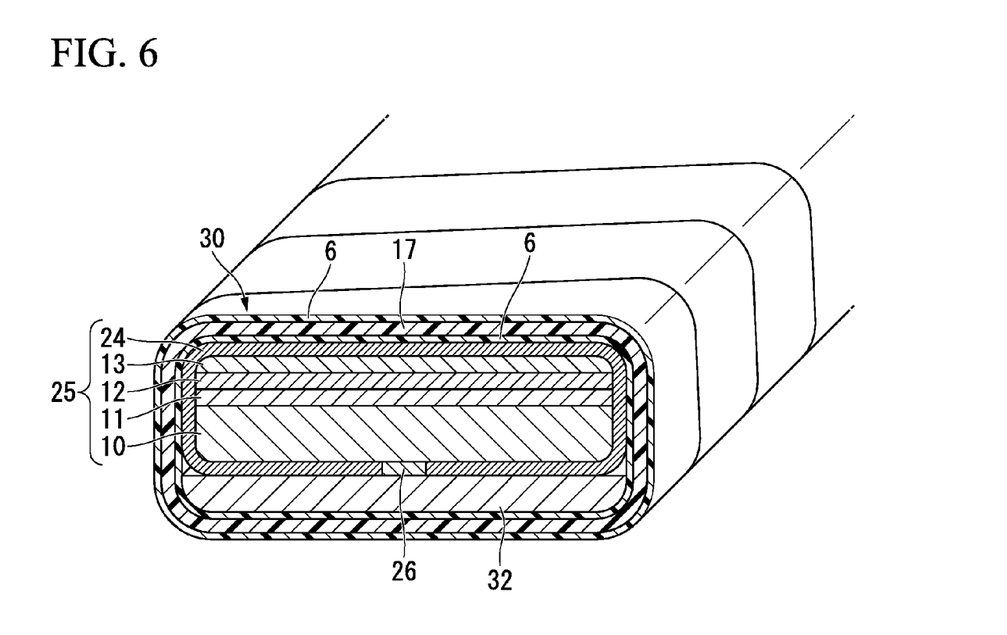
FIG. 6 is a cross-sectional perspective view illustrating part of an oxide superconductor wire according to a fourth embodiment of the present invention which is applied to the superconducting coil illustrated in FIG. 1.

FIG. 6 is a cross-sectional perspective view illustrating part of an oxide superconductor wire for forming a superconducting coil according to a fourth embodiment of the present invention.

In an oxide superconductor wire 30 illustrated in FIG. 6, the superconductor laminate 25 is formed by forming the intermediate layer 11, the oxide superconductor layer 12, and the first metal stabilizing layer 13 on one surface of the tape-shaped substrate 10 and forming the second metal stabilizing layer 24 so as to cover a circumference of the resultant.

In addition, a third metal stabilizing layer 32 is provided on one surface of the superconductor laminate 25, and the insulating coating layer 17 including the coating layer is formed so as to cover the entire portion of the resultant.

In this embodiment, the coating layer 6 is formed on both the inside and outside surfaces of the insulating coating layer 17.

In this embodiment, the coating layer 6 is formed on both the inside and outside surfaces of the insulating coating layer 17.

However, the coating layer 6 may be formed on only the outside surface of the insulating coating layer 17.

The second metal stabilizing layer 24 according to this embodiment is the same as that of the above-described embodiments, in that the second metal stabilizing layer 24 is formed in a C-shape in cross-section so as to cover the laminate.

However, the second metal stabilizing layer 24 according to this embodiment is different from that of the second embodiment, in that the third stabilizing layer 32 formed using a metal tape is laminated on an outside surface of the second metal stabilizing layer 24 on a side where the solder layer 26 is provided; and that the insulating coating layer 17 and the coating layer 6 are provided so as to cover the entire portion of the laminate in which the superconductor laminate 25 and the third stabilizing layer 32 are formed.

In addition, since there is a case where both the inside and outside surfaces of the second metal stabilizing layer 24 may be subjected to solder plating, a solder layer may be formed even on the outside surface of the second metal stabilizing layer 24.

In the oxide superconductor wire 30 illustrated in FIG. 6, the same components as those of the oxide superconductor wire 23 illustrated in FIG. 5 are represented by the same reference numerals, and the detailed description thereof will not be repeated.

In this embodiment, a coil is prepared by winding the oxide superconductor wire 30, which includes the coating layer 6 on the outermost surface thereof, clockwise, and a coil is prepared by winding the oxide superconductor wire 30 counterclockwise.

These coils are vertically combined to obtain a two-layer pancake coil.

Next, a desired number of two-layer pancake coils are laminated on a winding frame, and the obtained laminate is impregnated and fixed with an epoxy resin using a method such as vacuum impregnating such that the entire portion thereof is covered.

As a result, a superconducting coil having the same shape as that of the above-described superconducting coil can be obtained.

By cooling this superconducting coil to the critical temperature or lower to cause a current to flow therethrough, a desired magnetic force can be generated when the superconducting coil is applied to a superconducting magnet.

When this superconducting coil is used in a cooled state at the critical temperature or lower, stress is applied to the oxide superconductor wire 30 due to the thermal expansion of the impregnating resin caused by cooling.

The coating layer 6 formed of a fluororesin is formed on the outside surface of the oxide superconductor wire 30, and an adhesive strength at the interface between the coating layer 6 and the impregnating resin layer is not that high.

Accordingly, when the above-described stress is applied, delamination occurs at the interface between the coating layer 6 and the impregnating resin layer.

Part of the above-described stress is released by this delamination.

As a result, stress which induces delamination in the oxide superconductor wire 30 can be eliminated or suppressed.

Therefore, when the superconducting coil is used in a cooled state, deterioration in superconductivity is suppressed.

That is, even in structure according to the fourth embodiment, the same structure and effects as those of the first embodiment can be obtained.

Fifth Embodiment

Figure 7:
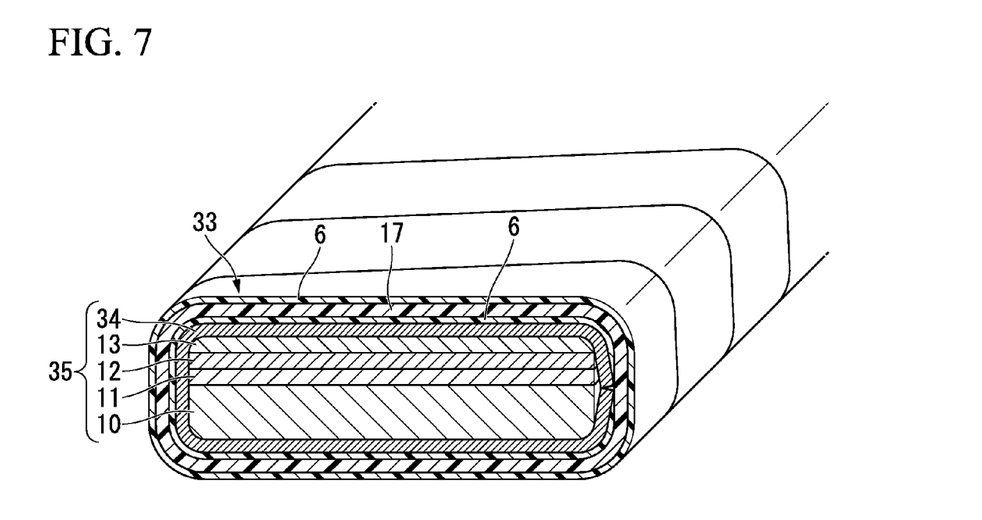
FIG. 7 is a cross-sectional perspective view illustrating part of an oxide superconductor wire according to a fifth embodiment of the present invention which is applied to the superconducting coil illustrated in FIG. 1.

FIG. 7 is a cross-sectional perspective view illustrating part of an oxide superconductor wire for forming a superconducting coil according to a fifth embodiment of the present invention.

In an oxide superconductor wire 33 having a cross-sectional structure illustrated in FIG. 7, a superconductor laminate 35 is formed by forming the intermediate layer 11, the oxide superconductor layer 12, and the first metal stabilizing layer 13 on one surface of the tape-shaped substrate 10 and forming a second metal stabilizing layer 34 on a circumference of the resultant.

In addition, the insulating coating layer 17 including the coating layer is formed so as to cover the entire portion of the superconductor laminate 35, and the coating layer 6 is formed on both inside and outside surfaces of the insulating coating layer 17.

In this embodiment, the coating layer 6 is formed on both the inside and outside surfaces of the insulating coating layer 17.

However, the coating layer 6 may be formed on only the outside surface of the insulating coating layer 17.

In this embodiment, by making edges of a metal tape abut each other and soldering or welding the edges, the second metal stabilizing layer 34 is arranged so as to cover the entire circumference of the superconductor laminate 35 in a state of being longitudinally attached in a C-shape in cross-section.

In addition, since there is a case where both the inside and outside surfaces of the second metal stabilizing layer 34 may be subjected to solder plating, a solder layer may be formed even on the outside surface of the second metal stabilizing layer 34.

In the oxide superconductor wire 33 illustrated in FIG. 7, the same components as those of the oxide superconductor wires according to the other embodiments are represented by the same reference numerals, and the detailed description thereof will not be repeated.

In this embodiment, a coil is prepared by winding the oxide superconductor wire 33, which includes the coating layer 6 on the outermost surface thereof, clockwise, and a coil is prepared by winding the oxide superconductor wire 33 counterclockwise.

These coils are vertically combined to obtain a two-layer pancake coil.

Next, a desired number of two-layer pancake coils are laminated on a winding frame, and the obtained laminate is impregnated and fixed with an epoxy resin using a method such as vacuum impregnating such that the entire portion thereof is covered.

As a result, a superconducting coil having the same shape as that of the above-described superconducting coil can be obtained.

By cooling this superconducting coil to the critical temperature or lower to cause a current to flow therethrough, a desired magnetic force can be generated when the superconducting coil is applied to a superconducting magnet.

In this example, when this superconducting coil is used in a cooled state at the critical temperature or lower, stress is applied to the oxide superconductor wire 33 due to the thermal expansion of the impregnating resin caused by cooling.

The coating layer 6 formed of a fluororesin is formed on the outside surface of the oxide superconductor wire 33, and an adhesive strength at the interface between the coating layer 6 and the impregnating resin layer is not that high.

Accordingly, when the above-described stress is applied, delamination occurs at the interface between the coating layer 6 and the impregnating resin layer.

Part of the above-described stress is released by this delamination.

As a result, stress which induces delamination in the oxide superconductor wire 33 can be eliminated or suppressed.

Therefore, when the superconducting coil is used in a cooled state, deterioration in superconductivity is suppressed.

That is, even in the structure according to the fifth embodiment, the same structure and effects as those of the first embodiment can be obtained.

In FIGS. 3 to 7, an insulating tape coated with the coating layer is directly wound around the superconductor laminate. However, the uncoated insulating tape may be wound between an insulating tape coated with the coating layer and the superconductor laminate. Also, the uncoated insulating tape may be wound around the outer surface of the insulating tape coated with the coating layer, the insulating tape coated with the coating layer being wound around the superconductor laminate.

Figure 8:
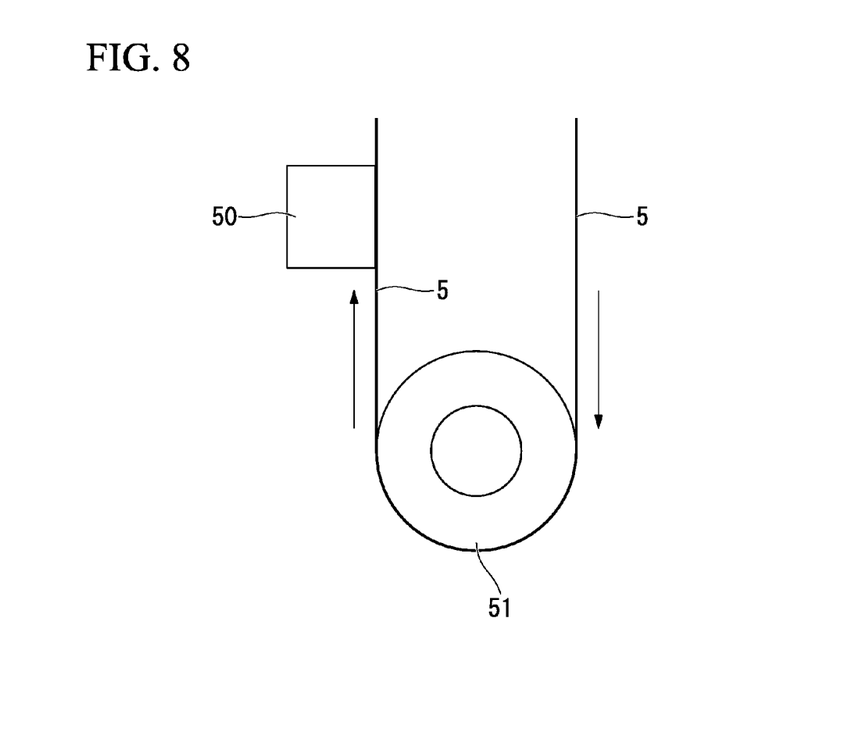
FIG. 8 is a block diagram illustrating an example of a process which is applied when a thin superconductor wire is coated with an insulating coating layer.

FIG. 8 is a diagram schematically illustrating a configuration of part of a transport line which is applied to a process of winding an insulating coating layer including a coating layer around an outer circumference of a superconductor laminate.

In this transport line, an insulating tape on which the coating layer 6 is formed is wound around the outside surface of the superconductor laminate 15 using a winding machine (not illustrated) to form the insulating coating layer 17 on the superconductor laminate 15.

In addition, after the oxide superconductor wire 5 is prepared, the oxide superconductor wire 5 is guided through a metal guide member 50 for preventing the oxide superconductor wire 5 from being separated from the line.

The oxide superconductor wire 5 including the insulating coating layer changes its direction along the line through a roller 51 and is transported to the next line while being guided by the guide member 50 so as not to be separated from the line.

At this time, there is a case where the oxide superconductor wire 5 is separated from the transport line by approximately several millimeters.

In this case, when the guide member 50 presses the oxide superconductor wire 5 with a strong force, the outside surface of the insulating coating layer 17 strongly rubs against a guide surface of the guide member 50 due to this pressing force.

As a result, there is a concern that part of the insulating coating layer 17 may be cut or damaged.

In this embodiment, the coating layer 6 of a fluororesin is provided on the outside surface of the insulating coating layer 17.

Therefore, even if the insulating coating layer 17 strongly rubs against the above-described guide member 50, as a result of a decreased friction, the insulating coating layer 17 is not cut or damaged.

EXAMPLES

An $Al_2O_3$ layer (diffusion prevention layer; thickness: 150 nm) was formed using a sputtering method on a substrate made of HASTELLOY (trade name, manufactured by Haynes International Inc.) which had a tape shape having a width of 10 mm, a thickness of 0.1 mm, and a length of 50 m.

Then a $Y_2O_3$ layer (bed layer; thickness: 20 nm) was formed on the $Al_2O_3$ layer using an ion beam sputtering method.

Next, an MgO layer (intermediate layer; thickness: 10 nm) was formed on the bed layer using an ion beam assist sputtering method (IBAD method).

Then, a $CeO_2$ layer (cap layer) having a thickness of 1.0 μm was formed on the MgO layer using a pulse laser deposition method (PLD method).

Next, a $GdBa_2Cu_3O_7$ layer (oxide superconductor layer) having a thickness of 1.0 μM was formed on the $CeO_2$ layer using a PLD method.

Further, a silver layer (first metal stabilizing layer) having a thickness of 8 μm was formed on the oxide superconductor layer using a sputtering method.

Next, a copper tape (second metal stabilizing layer) having a thickness of 0.1 mm was joined onto the silver layer using a tin solder (melting point: 230° C.) to prepare a superconductor laminate.

Next, a polyimide tape having a total thickness of 15 μm and a width of 4 mm in which an FEP coating layer having at thickness of 1.25 μm was formed on both surfaces thereof was prepared.

This polyimide tape was wound around the superconductor laminate by butt-winding to form an insulating coating layer which covered an outside surface of the superconductor laminate.

As a result, an oxide superconductor wire was obtained.

A critical current characteristic of the oxide superconductor wire in a longitudinal direction thereof was evaluated using a magnetization method before and after a peeling test described below.

In the peeling test, regarding the oxide superconductor wire prepared as above, an epoxy resin was attached to a tip of an aluminum stud pin (φ=7.1 mm), and this stud pin was pressed against the FEP coating layer on the insulating coating layer surface, followed by thermal curing.

As a result, the stud pin was bonded to the insulating coating layer provided with the FEP coating layer.

Next, this stud pin was pulled out in a direction away from the insulating coating layer along an axial direction.

When this stud pin was separated from the insulating coating layer provided with the FEP coating layer, a peel strength was measured.

In addition, whether or not the polyimide tape of the sample after the test was ruptured and a surface property of the polyimide tape were examined by visual inspection, and the results thereof are shown in Table 1 below as release properties.

Comparative Example

A polyimide tape (thickness: 12.5 μm) which was not subjected to FEP coating was prepared, and this polyimide tape was wound around the above-prepared superconductor wire by butt-winding under the same conditions as those of the above-described example, to form an insulating coating layer which covered an outside surface of the superconductor wire.

As a result, an oxide superconductor wire according to a comparative example was obtained.

The same peeling test as that of the above-described example was performed to measure the peel strength.

In addition, whether or not the polyimide tape of the sample after the test was ruptured and a surface property of the polyimide tape were examined by visual inspection, and the results thereof are shown in Table 1 below as release properties.

In Table 1, "Superior" shown in the item "Evaluation Result of Critical Current Before and After Test Manufacturing" represents that the following relational expression $Ic/Ic0 \geq 95$ is satisfied, the relational expression indicating a ratio of a critical current density value (Ic0) of the oxide superconductor wire measured before test manufacturing to a critical current density value (Ic) of the oxide superconductor wire measured after test manufacturing.

TABLE 1

| Item | Comparative Example | Example |
|---|---|---|
| Thickness of Substrate (μm) | 100 | 100 |
| Thickness of Stabilizing Copper Layer (μm) | 100 | 100 |
| Structure of Copper Stabilizing Layer | Bonding | Bonding |
| Width of Wire Material | 10 mm | 10 mm |
| Thickness of Insulating Polyimide Tape | 12.5 μm | 12.5 μm |
| Total Thickness of Insulating Polyimide Tape Provided With Coating Layer | No Coating Layer | 15 μm |
| Number of Sheets of Insulating Tape | One Sheet, Butt-Winding | One Sheet, Butt-Winding |
| Length of Test-Manufactured Product | 50 m | 50 m |
| Evaluation Result of Critical Current Before and After Test Manufacturing | Superior | Superior |
| Peeling Test Result (N = 30) | Average Value: 3.64 MPa Maximum Value: 4.87 MPa Minimum Value: 2.20 MPa | Average Value: 2.21 MPa Maximum Value: 4.27 MPa Minimum Value: 0.81 MPa |
| Release Properties with Epoxy Resin | N = 30, all of which were poor | N = 30, all of which were superior |

According to the test results shown in Table 1, in all of the samples according to the comparative example, the polyimide tape portion was ruptured while being attached to the stud pin.

On the other hand, in all of the samples of the example, the stud pin was peeled off from the polyimide tape including the FEP coating layer.

The following facts can be seen from these results.

When the polyimide tape including the FEP coating layer is used as the insulating coating layer, if stress in a peeling direction is applied to the oxide superconductor wire, the epoxy resin portion is reliably peeled off from the FEP coating layer, and thus stress which is applied to the laminate structure of the oxide superconductor wire can be released.

On the other hand, when the insulating coating layer on which the polyimide tape which is not subjected to FEP coating is formed is used, the polyimide tape and the epoxy resin are strongly bonded to each other, and thus stress is applied such that the polyimide tape is ruptured or any layer in the oxide superconductor wire of the laminate structure is peeled off.

It can be considered from the test results that, when the superconducting coil, which is prepared by coiling the oxide superconductor wire, is impregnated and fixed with the epoxy resin and the superconducting coil is cooled to the critical temperature or lower, stress generated by the shrinkage of the impregnating resin is directly applied to the oxide superconductor wire.

On the other hand, in the structure of the example, when stress generated by the shrinkage of the impregnating resin is applied to the superconducting coil formed using the oxide superconductor wire, delamination occurs at the interface between the impregnating resin and the FEP coating layer, and thus part of the stress can be released.

Therefore, it is considered that, when the superconducting coil formed using the oxide superconductor wire is hardened with the impregnating resin, deterioration in superconductivity is suppressed.

In addition, when the critical current value of the oxide superconductor wire is measured before and after coiling, $Ic/Ic0 \geq 95$ is satisfied.

Therefore, deterioration in the critical current characteristic of the superconductor wire is not observed.

<Test Manufacturing of Superconducting Coil>

Using a substrate made of HASTELLOY (trade name, manufactured by Haynes International Inc.) which had a tape shape having a width of 5 mm, a thickness of 0.1 mm, and a length of 50 m, an oxide superconductor wire having the same laminate structure as that of the above-described example was prepared.

An outer circumference of the oxide superconductor wire was the insulating coating layer which was formed using the polyimide tape in which the FEP coating layer was formed on both the surfaces thereof.

Using this oxide superconductor wire, a double pancake coil having an inner diameter of 70 mm and a height of 10.5 mm was prepared, and a superconducting coil was test-manufactured under a condition of the number of turns of 200 turns (100 turns×2 layers).

In addition, for comparison, a superconducting coil was test-manufactured in the same manner using an oxide superconductor wire provided with an insulating coating layer which was formed using a polyimide tape on which a FEP coating layer was not formed.

Test manufacturing conditions are shown in Table 2.

TABLE 2

| Item | Comparative Example 2 | Example 2 |
|---|---|---|
| Insulating Tape | Polyimide Tape, 12.5 μm, one sheet butt-winding | Polyimide Tape Provided With Fluororesin Coating Layer, 15.0 μm, one sheet butt-winding |
| Flowing Current (A) | 200 | 200 |
| Coil Current Density (A/mm$^2$) | 125.8 | 121.7 |
| Coil Central Magnetic Field (T) (at 20 K) | 0.576 | 0.571 |
| Coil Inner Diameter (mm) | 60 | 60 |
| Coil Outer Diameter (mm) | 120 | 122 |
| Coil Height (mm) | 20.5 | 20.5 |
| Number of Turns/Layer | 100 | 100 |
| Number of Layers | 2 | 2 |
| Length of Wire Material Used (m) | 56.5 | 57.2 |

In Example 2 of Table 2, the thickness of the polyimide tape was 12.5 μm, and the thickness of the fluororesin coating layer was 1.25 μm (the total thickness of the two layers on both the inside and outside surfaces was 2.5 μm).

In Example 3, the thickness of the polyimide tape was 7.5 μm (the total thickness of the two layers on both the inside and outside surfaces was 2.5 μm).

It can be seen from the results shown in Table 2 that, when the superconducting coil of Example 2 is compared to the superconducting coil of Comparative Example 2, the flowing current is the same, and the coil current density and the coil central magnetic field are slightly decreased; however, the same superconductivity at substantially the same size is exhibited.

Next, the results of a test in which an oxide superconductor wire having the above-described structure and a length of 25 m was transported along a line using the roller and the guide member illustrated in FIG. 8 will be described.

In the line transport test, an oxide superconductor wire having the same structure as that of the above-described oxide superconductor wire (Example 2) for test-manufacturing a superconducting coil and having a length of 25 m was separately prepared, the oxide superconductor wire was hung around the roller having a configuration illustrated in FIG. 8 and an outer diameter of 200 mm at a tensile strength of 2 kg such that a direction thereof on an entry side was changed by 180° to a direction on an exit side, and the oxide superconductor wire was transported along the line while being held using the cuboidal guide member (cube having a size of length 40 mm×width 20 mm×height 20 mm) illustrated in FIG. 8.

The guide member was provided at a position which was 15 cm distant from a position (contact position between the superconductor wire and the outer circumference of the roller) where the oxide superconductor wire was separated from the outer circumference of the roller.

The oxide superconductor wire which was used in the line transport test was the oxide superconductor wire provided with the insulating coating layer obtained by butt-winding the polyimide tape having a width of 4 mm which included the fluororesin coating layer.

In addition, an oxide superconductor wire having the same structure as the structure for test-manufacturing a superconducting coil according to Comparative Example 2 and having a length of 25 m was separately prepared.

The oxide superconductor wire provided with the insulating coating layer, which was subjected to butt-winding under the same conditions as above, was guided.

These oxide superconductor wires are different from each other, in that the fluororesin coating layer is formed on both surfaces of the polyimide tape only in the oxide superconductor wire of Example 2.

A result of the line transport test using the guide member was that, when the oxide superconductor wire having the same structure as that of Comparative Example 2 in which an edge state was sharp and the tape was easily cut was used, the insulating tape was cut at 5 or more positions in the lot.

However, in the oxide superconductor wire provided with the fluororesin coating layer, the coating layer was not ruptured.

It was clearly seen from the results of the line transport test that, when the oxide superconductor wire including the fluororesin coating layer is transported along a line, there are advantageous effects for cases where an oxide superconductor wire is transported.

The oxide superconductor wire may be a long member having a length of several tens to several hundreds of meters according to the purpose.

Therefore, in a production field where a site area is limited, it is necessary that various kinds of coating treatments and operations be performed while changing a transport direction.

Accordingly, it is necessary that the transport direction be changed using the roller and the guide member illustrated in FIG. 8.

<Evaluation of Superconducting Coil>

Using a substrate made of HASTELLOY (trade name, manufactured by Haynes International Inc.) which had a tape shape having a width of 5 mm, a thickness of 0.1 mm, and a length of 50 m; and a copper tape (second metal stabilizing layer) having a thickness of 0.1 mm, an oxide superconductor wire having the same laminate structure as that of the above-described Example 1 was prepared.

Using this superconductor wire, two kinds of superconducting coils (double pancake coils) of Example A and Example B illustrated in Table 3 in which a ratio of an outer diameter of the coil to an inner diameter thereof was higher than or equal to 2 were test-manufactured.

In Example A and Example B, the configurations of the insulating coating layers were different.

Specifically, in Example A, a polyimide tape (thickness: 12.5 μm) was butt-wound around a superconductor laminate, and a polyimide tape (thickness: 15 μm) including a fluororesin coating layer covered an outside surface of the superconductor wire in a state where one sheet thereof was longitudinally attached.

As a result, an insulating coating layer was formed, and an oxide superconductor wire was obtained.

On the other hand, in Example B, at least one sheet of polyimide tape (thickness: 12.5 μm) including a fluororesin coating layer was butt-wound so as to cover a superconductor laminate.

As a result, an insulating coating layer was formed, and an oxide superconductor wire was obtained.

Table 3 below shows coil critical currents and n values of these oxide superconductor wires at 77 K before and after impregnation fixing are shown.

Further, in a heat cycle test, a process of leaving a sample to stand in an environment of 77 K for a predetermined time and then leaving the sample to stand at room temperature for a predetermined time was set as one cycle.

Table 3 below shows coil critical currents and n values at 77 K after repeating the above-described cycle three times and five times.

TABLE 3

| Item | Example A | Example B |
|---|---|---|
| Insulating Tape | Polyimide Tape Having Thickness of 12.5 μm, Two Sheet Lap-Winding (Butt-Winding) + Fluororesin-Coated Polyimide Tape 15 μm (12.5 μm Polyimide + Coating Layer), One Sheet Longitudinal Attachment | Fluororesin-Coated Polyimide Tape 15 μm (12.5 μm Polyimide + Coating Layer), One Sheet (Butt Winding) |
| Coil Inner Diameter (mm) | 50 | 50 |
| Coil Outer Diameter (mm) | 109 | 112 |
| Coil Height (mm) | 11 | 11 |
| Number of Turns/Layer | 125 | 133 |
| Number of Layers | 2 | 2 |
| Total Number of Turns | 250 | 266 |
| Length of Wire material Used (m) | 50 | 60 |
| Coil Critical Current, n Value before Impregnation (77 K) | 70 A, n = 29 | 88 A, n = 18 |
| Coil Critical Current, n Value (77 K) | 68 A, n = 21 | 88 A, n = 18 |
| After Repeating Heat Cycle Three times (77 K ⇔ Room Temperature) | 66 A, n = 19 | 88 A, n = 19 |
| After Repeating Heat Cycle Five times (77 K ⇔ Room Temperature) | — | 88 A, n = 19 |
| Evaluation | Critical Density and n Value Deteriorated | Superior |

It was found that, when the ratio of the coil outer diameter to the coil inner diameter was higher than or equal to 2, in the superconducting coil in which one sheet of polyimide tape including the fluororesin coating layer was longitudinally attached as in the case of Example A, the critical currents and n values after the impregnation and after the repetitive heat cycle tests were decreased, and the properties deteriorated.

On the other hand, in the superconducting coil which was formed using the superconductor wire formed by winding at least one sheet of the polyimide tape including the fluororesin coating layer so as to cover the superconductor laminate as in the case of Example B, the results not only after the impregnation but after the repetitive heat cycle tests were superior.

Next, the evaluation results of the thickness of the fluororesin coating layer are shown in Table 4.

TABLE 4

| Coating Thickness (Single Side) | Evaluation Result |
|---|---|
| 1 μm | No Particular Problem |
| 1.5 μm | No Particular Problem |
| 3 μm | High Possibility of Problem Due to Clogging of Coating Scraps During Cutting |
| 3 μm | High Possibility of Problem Due to Coating Clogging of Coating Scraps During Cutting |

It was found from Table 4 that, when the thickness of the coating layer is increased, clogging occurs on a line during tape cutting, and a problem arises in manufacturability.

The present invention can be used in superconducting coils which are used in various kinds of superconducting devices such as a superconducting magnet device, a superconducting motor, and a current limiter.

What is claimed is:

1. An oxide superconductor wire comprising:
   a superconductor laminate that comprises a substrate which is formed in a tape shape and an intermediate layer, an oxide superconductor layer, and a metal stabilizing layer which are laminated on the substrate; and
   an insulating coating layer that covers an entire outside surface of the superconductor laminate, wherein
   both an entire outside surface and an entire inside surface of the insulating coating layer are coated with a coating layer formed of a fluororesin, the coating layer being arranged between the superconductor laminate and the insulating coating layer and contacting both the superconductor laminate and the insulating coating layer, the fluororesin being one of polytetrafluoroethylene, tetrafluoroethylene-hexafluoropropylene copolymer, perfluoroalkoxy fluororesin, and ethylene-tetrafluoroethylene copolymer.

2. The oxide superconductor wire according to claim 1, wherein
   the insulating coating layer is formed by winding an insulating tape around the superconductor laminate, the insulating tape being coated with the coating layer.

3. The oxide superconductor wire according to claim 2, wherein
   at least one sheet of the insulating tape is wound around the superconductor laminate so as to cover the entire outside surface thereof.

4. The oxide superconductor wire according to claim 3, wherein
   the thickness of the coating layer is 1 to 10 μm.

5. A superconducting coil comprising
   a coil body that is formed by winding the oxide superconductor wire according to claim 4 therearound.

6. A superconducting coil comprising
   a coil body that is formed by winding the oxide superconductor wire according to claim 3, wherein
   a ratio of an outer diameter of the superconducting coil to an inner diameter of the superconducting coil is higher than or equal to 2.

7. The superconducting coil according to claim 6, wherein the coil body is covered with an impregnating resin.

8. A superconducting coil comprising
   a coil body that is formed by winding the oxide superconductor wire according to claim 3 therearound.

9. The oxide superconductor wire according to claim 2, wherein
   the thickness of the coating layer is 1 to 10 μm.

10. A superconducting coil comprising
    a coil body that is formed by winding the oxide superconductor wire according to claim 9 therearound.

11. A superconducting coil comprising
    a coil body that is formed by winding the oxide superconductor wire according to claim 2 therearound.

12. The oxide superconductor wire according to claim 1, wherein
    the thickness of the coating layer is 1 to 10 μm.

13. A superconducting coil comprising
    a coil body that is formed by winding the oxide superconductor wire according to claim 12 therearound.

14. The oxide superconductor wire according to claim 1, wherein
the thickness of the coating layer is 1 to 10 µm.

15. A superconducting coil comprising
a coil body that is formed by winding the oxide superconductor wire according to claim 14 therearound.

16. A superconducting coil comprising
a coil body that is formed by winding the oxide superconductor wire according to claim 1 therearound.

17. The superconducting coil according to claim 16, wherein
the coil body is covered with an impregnating resin.

18. The oxide superconductor wire according to claim 1, wherein
an uncoated insulating tape is wound around an outer surface of the insulating coating layer coated with the coating layer.

* * * * *